United States Patent [19]
Frankel

[11] Patent Number: 6,106,630
[45] Date of Patent: Aug. 22, 2000

[54] CERAMIC-COATED HEATING ASSEMBLY FOR HIGH TEMPERATURE PROCESSING CHAMBER

[75] Inventor: Jonathan Frankel, San Jose, Calif.

[73] Assignee: Applied Materials, Inc., Santa Clara, Calif.

[21] Appl. No.: 08/908,249

[22] Filed: Aug. 7, 1997

[51] Int. Cl.$^7$ ................................................. C23C 16/44
[52] U.S. Cl. .......................... 118/728; 118/725; 427/454
[58] Field of Search ...................... 118/725, 728; 428/632, 652; 427/454

[56] References Cited

U.S. PATENT DOCUMENTS

| | | | |
|---|---|---|---|
| 3,663,788 | 5/1972 | Inoue | 219/76 |
| 4,703,153 | 10/1987 | Pelonis | 219/370 |
| 4,778,559 | 10/1988 | McNeilly | 156/612 |
| 5,231,690 | 7/1993 | Soma et al. | 392/416 |
| 5,252,807 | 10/1993 | Chizinsky | 219/390 |
| 5,280,156 | 1/1994 | Niori et al. | 219/385 |
| 5,306,895 | 4/1994 | Ushikoshi et al. | 219/385 |
| 5,350,720 | 9/1994 | Kawada et al. | 501/97 |
| 5,354,387 | 10/1994 | Lee et al. | 148/33.3 |
| 5,558,717 | 9/1996 | Zhao et al. | 118/715 |
| 5,705,080 | 1/1998 | Leung et al. | 216/67 |
| 5,720,818 | 2/1998 | Donde et al. | 118/500 |

FOREIGN PATENT DOCUMENTS

| | | |
|---|---|---|
| 0601788 A2 | 6/1994 | European Pat. Off. . |
| 0714998 A2 | 6/1996 | European Pat. Off. . |
| 0724285 A3 | 7/1996 | European Pat. Off. . |

OTHER PUBLICATIONS

Science and Technology of Surface Coating, Chapman and Anderson, ed., "The Basic Principles of Detonation Coating," by R.G. Smith, pp. 271–279, 1974.

*Primary Examiner*—Terrel Morris
*Assistant Examiner*—Cheryl Juska
*Attorney, Agent, or Firm*—Townsend Townsend & Crew

[57] ABSTRACT

The present invention provides systems, methods and apparatus for processing of semiconductor wafers. Specifically, embodiments of the present invention include apparatus designed to resist etching and deposition by processing and cleaning gases in a processing chamber. The apparatus of the present invention allow multiple process steps to be performed in situ in the same chamber to reduce total processing time and facilitate cleaning of the processing chamber. In one embodiment of the invention, a heating assembly for heating a semiconductor wafer within a deposition apparatus comprises a pedestal having a substantially planar upper surface for supporting the semiconductor wafer thereon and a heating element disposed therein for heating the wafer to the required temperatures for processing. According to the invention, the pedestal includes a protective layer substantially covering and adhered to the wafer support surface. The material used in the layer is substantially resistant to reactions with and deposition by process gases and cleaning gases at temperatures up to 500° C. The thickness of the protective layer usually ranges from about 2 to 30 mils and preferably between about 5 to 10 mils.

12 Claims, 11 Drawing Sheets

CERAMIC-COATED HEATING ASSEMBLY FOR HIGH TEMPERATURE PROCESSING CHAMBER

BACKGROUND OF THE INVENTION

The present invention relates to semiconductor processing. More specifically, the present invention is directed to wafer support members that are substantially resistant to process gases and cleaning gases encountered during processing.

One of the primary steps in fabricating modern semiconductor devices is forming a dielectric, metal, or semiconductor layer on a semiconductor substrate. As is well known, such a layer can be deposited by chemical vapor deposition (CVD). The process of depositing layers on a semiconductor wafer (or substrate) usually involves heating the substrate and holding it a short distance from a source of a stream of process gas flowing towards the substrate. In a conventional thermal CVD process, reactive gases are supplied to the substrate surface where heat-induced chemical reactions (homogeneous or heterogeneous) take place to produce a desired film. In a plasma enhanced chemical vapor deposition (PECVD) process, controlled plasma is formed to decompose and/or energize reactive species in reactive gases to produce the desired film. In general, reaction rates in thermal and plasma processes may be controlled by controlling one or more of the following: temperature, pressure, and reactant gas flow rate.

Semiconductor device geometries have dramatically decreased in size since such devices were first introduced several decades ago. Since then, integrated circuits have generally followed the two-year/half-size rule (often called "Moore's Law") which means that the number of devices which will fit on a chip doubles every two years. Today's wafer fabrication plants are routinely producing 0.5 $\mu$m and even 0.35 $\mu$m feature size devices, and tomorrow's plants soon will be producing devices having even smaller feature sizes. In the quest to achieve ever smaller devices, certain issues have become of greater concern to the industry.

One such issue relates to the removal of contaminants from the processing chamber. The problem of impurities causing damage to the devices on the substrate is of particular concern with today's increasingly smaller device dimensions. During CVD processing, reactive gases released inside the processing chamber form layers such as silicon oxides or nitrides on the surface of a substrate being processed, and undesirable oxide deposition occurs elsewhere in the CVD apparatus, such as in the area between the gas mixing box and gas distribution manifold.

Build-up of surface deposits on the inside of the processing chamber surfaces may cause flakes or particles of the deposited material to fall from the surface of the chamber onto the substrate being processed, potentially causing defects. To avoid this problem, the inside surfaces of the processing chamber are typically cleaned by etching (e.g. plasma cleaning) their surfaces with fluorine gas to remove the dielectric material deposited by the deposition gas. Bare aluminum surfaces inside the chamber are subject to fluorine gas attack which results in unwanted aluminum fluoride (AlF) film growth. To remove the film growth, the susceptor or pedestal surface is often scraped after fluorine gas cleaning. If the suspector or pedestal is not cleaned, the aluminum fluoride film is susceptible to cracking and peeling which may cause additional particle contamination.

As would be expected, cleaning interferes with processing throughput. To reduce exposure and limit downtime from periodic chamber cleaning, it is desirable to provide multiple deposition and cleaning capabilities in a single chamber with a simplified design to minimize the time consumed for different types of chamber processes. With growing pressures on manufacturers to improve processing quality and overall efficiency, eliminating the total down-time in a multiple-step process without compromising the quality of the wafers has become increasingly important for saving both time and money. To achieve such a chamber, the components used for such a chamber would preferably be resistant to etching from cleaning gases and deposition by process gases.

In light of the above, improved methods, systems and apparatus are desired for high quality, efficient, deposition and cleaning. In particular, the desired system should allow for multiple processing and cleaning steps to occur within the same chamber without degradation in performance resulting from deposition or reaction with process or cleaning gases. Elements of the system are desirably resistant to corrosion and deposition from deposition and cleaning processes.

SUMMARY OF THE INVENTION

The present invention is directed to the processing of semiconductor wafers. Specifically, embodiments of the present invention include apparatus designed to resist etching and deposition by processing and cleaning gases in a processing chamber. This enables multiple process steps to be performed in situ in the same chamber to reduce total processing time and to facilitate cleaning of the processing chamber. Performing multiple process steps in the same chamber increases the control over process parameters, substantially reduces moisture content in deposited films, and minimizes device damage due to metal contamination or process residue contamination.

In one aspect of the invention, a heating assembly for heating a semiconductor wafer within a deposition apparatus comprises a pedestal having a substantially planar upper surface for supporting the semiconductor wafer thereon and a heating element disposed therein for heating the wafer to the required temperatures for processing. According to the invention, the pedestal includes a protective layer substantially covering and adhered to the wafer support surface. The material used in the layer is substantially resistant to reactions with and deposition by process gases and cleaning gases at temperatures up to about 500° C. The protective layer is preferably substantially resistant to reactions with, and deposition by, argon-containing gases, oxygen-containing gases, nitrogen-containing gases, helium-containing gases, fluorine-containing gases, boron-containing gases, phosphorous-containing gases, and silicon-containing gases.

In a specific configuration, the protective layer comprises a layer of ceramic material such as aluminum oxide. The protective layer may further be formed from alumina doped with titanium oxide which provides improved electrical conductivity between the wafer and the pedestal. The pedestal is typically shaped like a disc and has an upper surface, a peripheral surface, and a bottom surface. The protective layer may cover all three surfaces or, at minimum, at least the upper surface where the wafer rests. The materials in the layer are resistant to process gases and can further resist etching from cleaning gases like fluorine. The thickness of the protective layer usually ranges from about 2 to 30 mils and preferably between about 5 to 10 mils.

The pedestal of the heating assembly underlying the protective layer is typically formed from a process-compatible material such as aluminum or an aluminum alloy. This material provides both structural and economic advantages. Aluminum or aluminum-alloy pedestals do not become brittle upon repeated heating and cooling during wafer processing. This provides durability and structural integrity needed for such manufacturing equipment. Additionally, aluminum-based material is generally less expensive than ceramic, and the manufacturing/assembly costs for aluminum are also comparably less. Coating such a pedestal with a layer of protective material such as ceramic offers the structural advantages of aluminum while maintaining the corrosion resistance of ceramic. Additionally, the resulting protective layer is typically so thin that it eliminates electrostatic charge buildup and electrostatic sticking that may occur between the pedestal and the wafer. The layer would preferably have a thickness and a density comparable to that of a sintered layer of ceramic.

In a specific embodiment of the heating assembly, the pedestal is coated with a transition material, such as nickel, between the protective layer and the pedestal. The transition material has a coefficient of thermal expansion between that of the protective layer (e.g. alumina) and the pedestal (e.g. aluminum). Due to the substantial difference in the coefficient of thermal expansion for alumina and aluminum, repeated heating and cooling of the pedestal may cause microcracking in a layer of alumina applied directly to an aluminum pedestal. Accordingly, a layer of transition material, such as nickel, restrains the expansion of the underlying aluminum and thus minimizes microcracking of the outer alumina layer that may otherwise occur if the alumina layer were applied directly to the pedestal.

In an exemplary embodiment, a system of the present invention for fabricating integrated circuit (IC) devices generally comprises an enclosure assembly, a vacuum system, and a support assembly. The enclosure assembly houses a processing chamber having a gas inlet and a gas outlet for receiving and discharging process gases, respectively. The vacuum system connects to the processing chamber and allows the processing chamber to operate at subatmospheric pressures between about 10 and 760 torr. The heating assembly is disposed within the processing chamber and includes a pedestal for supporting the semiconductor wafer and a heating element for heating the wafer. The pedestal has a wafer support surface which is covered with a protective material that substantially resists process gases at temperatures up to about 500° C.

In another aspect of the invention, a method is provided for forming a wafer support pedestal with a detonation gun process. The detonation gun process of the present invention comprises providing a pedestal having a substantially planar surface, introducing a ceramic powder into a combustible gas mixture, and igniting the gas mixture to propel the resulting product of gas and ceramic powder onto the planar surface of the pedestal to form a thermally and chemically protective layer thereon. In a preferred embodiment, the propelling step involves creating a detonation wave to accelerate the powder to a speed of at least about 700 meters per second. The powder is heated to a temperature near the melting point of the powder.

The detonation gun process of the present invention creates a coating of ceramic comparable to a layer of sintered ceramic without the drawback of binder contamination. In conventional ceramic manufacturing processes, a binder is used to promote sintering in the ceramic material. Even after processing, some of the binder may remain in the ceramic. The semiconductor wafer being processed in a CVD chamber lies directly on the ceramic layer of the pedestal, and any binder contained in the ceramic may cause contamination of the semiconductor wafer. Wafer contact with the binder will likely decrease the quality of the semiconductor devices processed by the CVD chamber. The detonation gun process of the present invention, however, provides a ceramic layer without using binders which may contaminate the semiconductor wafer. The resulting layer has density and porosity comparable to a sintered ceramic and is also about 10–20 times thicker than ceramic coverage that may be formed from methods such as anodization. Due to the molecular structure and growth pattern of alumina, anodization typically results in a columnar crystallization pattern that does not provide a uniform, nonporous coverage. The detonation gun of the present invention creates a more uniform protective layer which results in improved corrosion protection and further eliminates undesirable differences in the electrical and chemical insulating properties across the wafer support surface which can cause undesirable variations in the plasma. Such variations can contribute to non-uniform deposition on the wafer substrate surface.

These and other embodiments of the present invention, as well as its advantages and features, are described in more detail in conjunction with the text below and attached figures.

DETAILED DESCRIPTION OF THE SPECIFIC EMBODIMENTS

I. Overview of a Representative CVD Apparatus

Figure 1A:
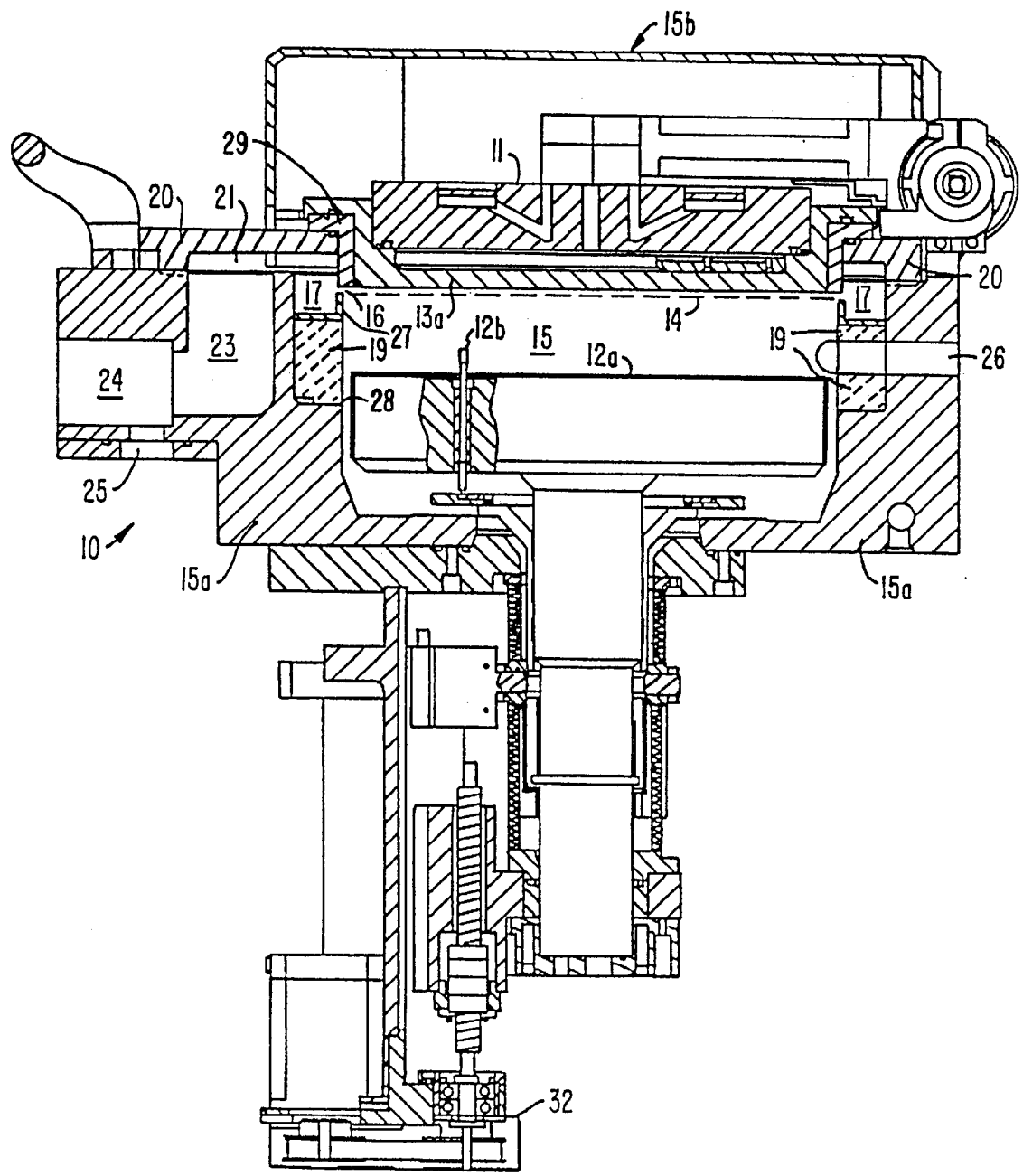
FIGS. 1A and 1B are vertical, cross-sectional views of one embodiment of a chemical vapor deposition apparatus according to the present invention.
Figure 1B:
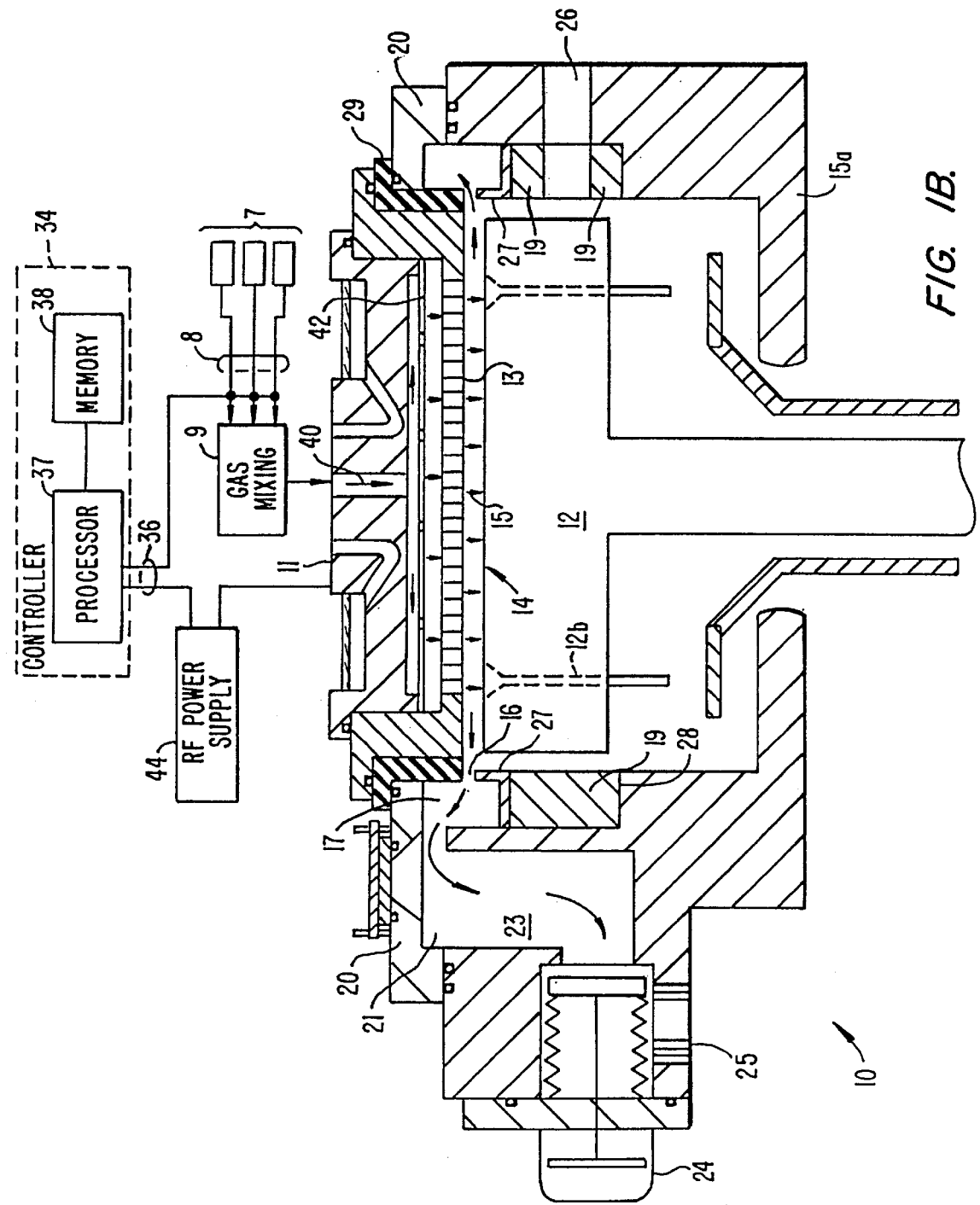
Figure 1C:
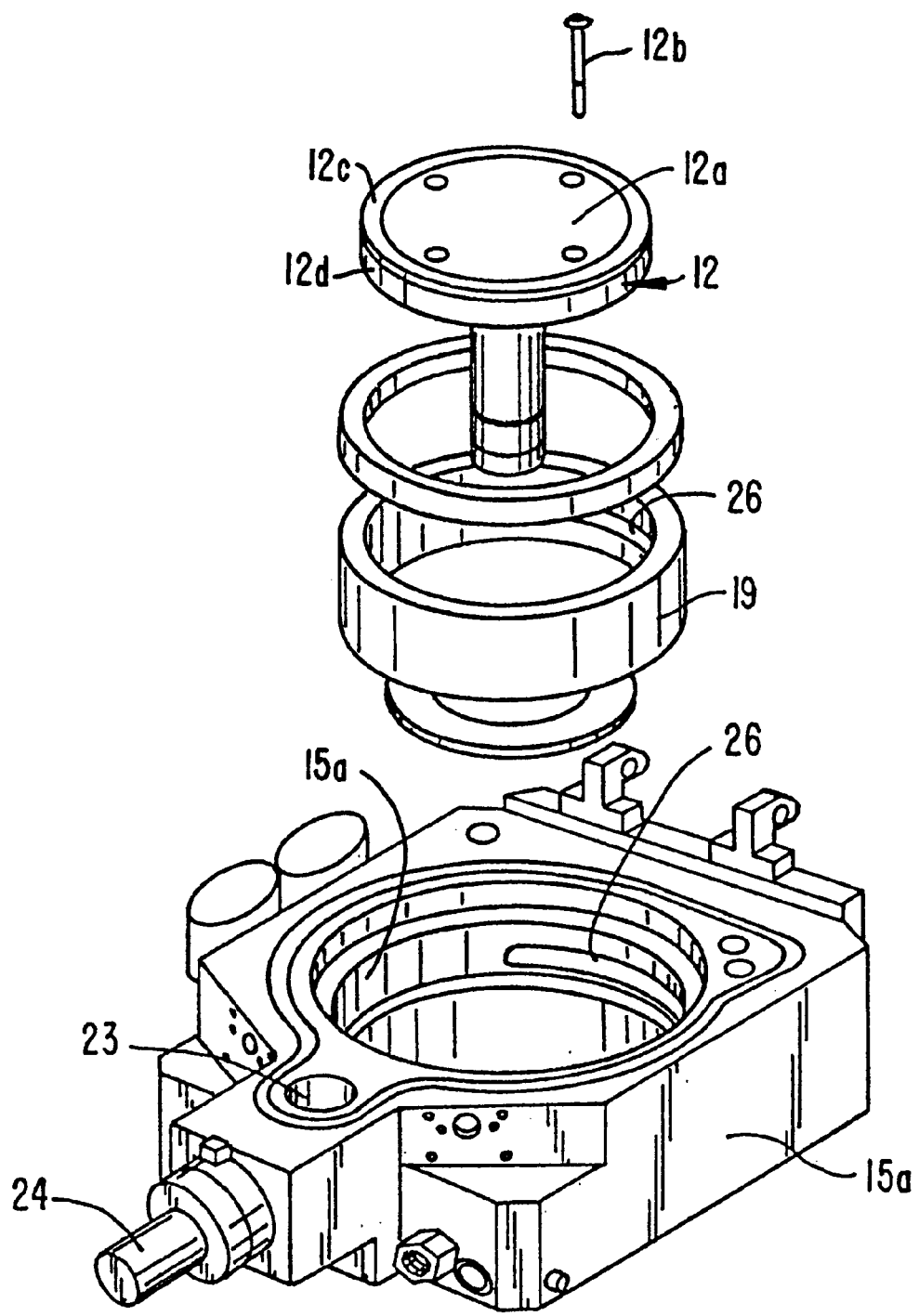
FIGS. 1C and 1D are exploded perspective views of parts of the CVD apparatus depicted in FIG. 1A.
Figure 1D:
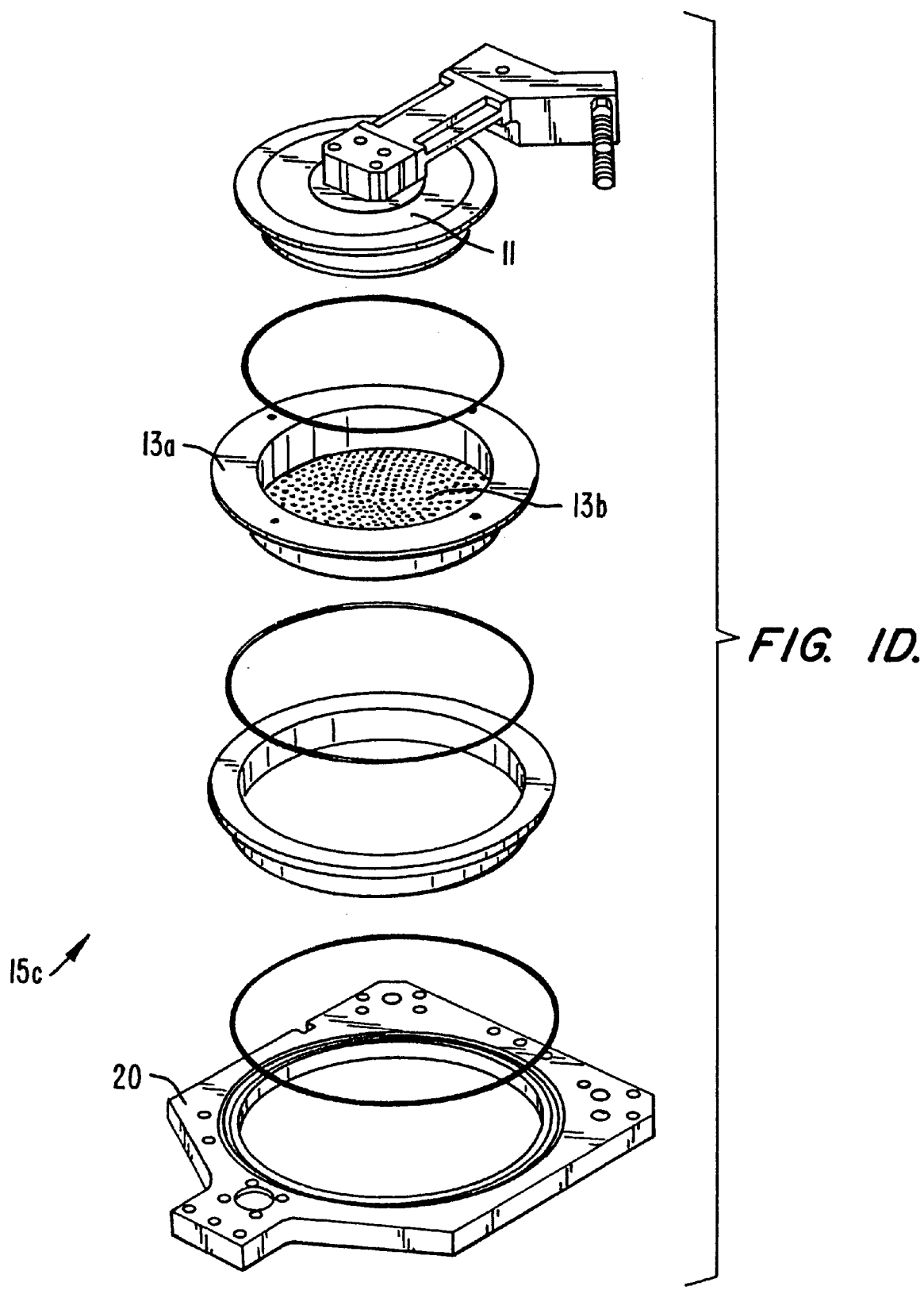

An overview of the CVD apparatus of the present invention is shown in FIGS. 1A and 1B, which are vertical, cross-sectional views of a CVD apparatus 10, having a vacuum or processing chamber 15 that includes a chamber wall 15a and chamber lid assembly 15b. Chamber wall 15a and gas distribution system 15c are shown in exploded, perspective views in FIGS. 1C and 1D, respectively. Operating temperatures encountered in the chamber may range from about 50° C. to 500° C., preferably between about 350° C. and 500° C., and most preferably between about 400° C. and 480° C.

Apparatus 10 contains a gas distribution manifold 11 for dispersing process gases to a substrate (not shown) that rests on a heater pedestal 12 centered within the process chamber. During processing, the substrate (e.g. a semiconductor wafer) is positioned on a flat (or slightly convex) surface 12a of pedestal 12. The pedestal can be moved controllably between a lower loading/off-loading position (depicted in FIG. 1A) and an upper processing position (indicated by dashed line 14 in FIG. 1A and shown in FIG. 1B), which is closely adjacent to manifold 11. A centerboard (not shown) includes sensors for providing information on the position of the wafers.

Deposition and carrier gases are input from gas sources 7 through gas supply lines 8 (FIG. 1B) into a mixing system 9 where they are combined and then sent to manifold 11. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases are used in the process, the several safety shut-off valves are positioned on each gas supply line in conventional configurations.

Deposition and carrier gases are introduced into chamber 15 through perforated holes 13b (FIG. 1D) of a flat, circular gas distribution face plate 13a. More specifically, deposition process gases flow into the chamber through the inlet manifold 11 (indicated by arrow 40 in FIG. 1B), through a perforated blocker plate 42 and then through holes 13b in gas distribution faceplate 13a.

The deposition process performed in apparatus 10 can be either a thermal process or a plasma enhanced process. In a plasma enhanced process, an RF power supply 44 applies electrical power between the gas distribution faceplate 13a and the pedestal so as to excite the process gas mixture to form a plasma within the cylindrical region between the faceplate 13a and the pedestal. (This region will be referred to herein as the "reaction region"). Constituents of the plasma react to deposit a desired film on the surface of the semiconductor wafer supported on pedestal 12. RF power supply 44 is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 15.

During a deposition process, the plasma heats the entire process chamber 10, including the walls 15a of the chamber surrounding the exhaust passageway 23 and the shut-off valve 24. When the plasma is not turned on, a hot liquid is circulated through the walls 15a of the process chamber to maintain the chamber at an elevated temperature. Fluids used to heat the chamber walls 15a include water-based ethylene glycol or oil-based thermal transfer fluids. This heating beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction products, is evacuated from the chamber by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of a circular chamber lid 20. The 360° circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

Typically, any or all of the chamber lining, gas inlet manifold faceplate, and various other apparatus hardware are made out of material such as aluminum or anodized aluminum. An example of such a CVD apparatus is described in U.S. Pat. No. 5,558,717 entitled "CVD Processing Chamber," issued to Zhao et al. The U.S. Pat. No. 5,558,717 patent is assigned to Applied Materials, Inc., the assignee of the present invention, and is hereby incorporated by reference in its entirety.

During both etching and deposition the plasma is excited by applying an RF voltage between the wafer support pedestal and the gas distribution plate 13b. As will be discussed below, the pedestal 12 has a dielectric covering, so it increases the electrical impedance between the plasma and the pedestal. If the aluminum chamber wall 15a (FIG. 1A) were exposed to the plasma, it would present a lower impedance path for current from the plasma, and therefore would undesirably deflect away from the semiconductor wafer the plasma containing the deposition process reagents, thereby lowering the rate of deposition on the wafer and depositing material on the chamber walls.

This problem can be overcome by covering the interior surface of the cylindrical chamber wall with a dielectric lining which imposes an electrical impedance between the chamber wall and the plasma body which is substantially greater than the electrical impedance between the pedestal and the plasma body. A high electrical impedance can be achieved by making the dielectric liner on the wall much thicker than the covering on the pedestal, and, optionally, by also selecting a material for the wall liner having a lower dielectric constant than the material on the pedestal. In our deposition chamber, the inside of the chamber wall is covered by upper and lower annular dielectric liners 19 and 27 (although a single liner could be used). (See FIGS. 1A and 1B.) The upper liner rests on the lower liner, which rests on a shelf 28 on the chamber wall. Additionally, the inside surface of the chamber lid 20 is covered by an insulator 29 which insulates the gas distribution plate 13a from the chamber lid. Details on a suitable insulator 29 can be found in U.S. Pat. No. 5,558,717 entitled "CVD Processing Chamber," issued to Zhao et al., the complete disclosure of which was previously incorporated by reference.

As shown in FIG. 1A, a lift assembly and motor 32 raises and lowers the heater pedestal 12 and its wafer lift pins 12b as wafers are transferred into and out of the body of the chamber by a robot blade (not shown) through an insertion/removal opening 26 in the side of the chamber 10. The motor 32 raises and lowers pedestal 12 between a processing position 14 and a lower, wafer-loading position. The motor, valves or flow controllers connected to the supply lines 8, gas delivery system, throttle valve, RF power supply 44, and chamber and substrate heating systems are all controlled by a system controller 34 (FIG. 1B) over control lines 36, of which only some are shown. Controller 34 relies on feedback from optical sensors to determine the position of movable mechanical assemblies such as the throttle valve and susceptor which are moved by appropriate motors under the control of controller 34.

In a preferred embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of the CVD machine. The system controller executes system control software, which is a computer program stored in a computer-readable medium such as a memory 38. Preferably, memory 38 is a hard disk drive, but memory 38 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 34.

Figure 1E:
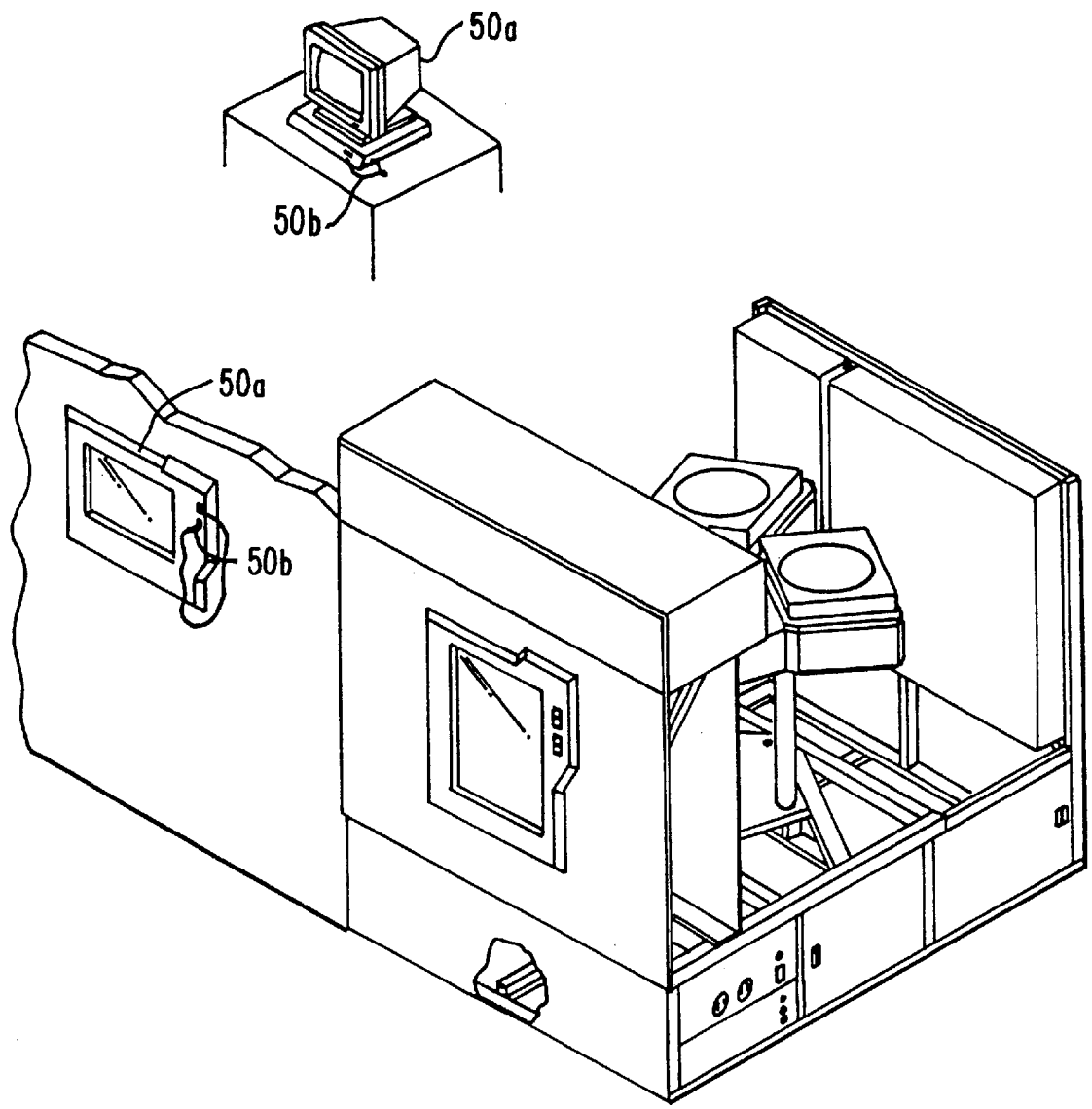
FIG. 1E is a simplified diagram of system monitor and CVD apparatus 10 in a multichamber system, which may include one or more chambers.

The interface between a user and controller 34 is via a CRT monitor 50a and light pen 50b, shown in FIG. 1E, which is a simplified diagram of the system monitor and CVD system 10 in a substrate processing system, which may include one or more chambers. In the preferred embodiment two monitors 50a are used, one mounted in the clean room wall for the operators and the other behind the wall for the service technicians. The monitors 50a simultaneously display the same information, but only one light pen 50b is enabled. A light sensor in the tip of light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with controller 34.

The process for depositing the film can be implemented using a computer program product that is executed by controller 34. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Windows™ library routines. To execute the linked, compiled object code the system user invokes the object code, causing the computer system to load the code in memory. The CPU then reads and executes the code to perform the tasks identified in the program.

The above apparatus description is mainly for illustrative purposes, and other plasma CVD equipment such as electron cyclotron resonance (ECR) plasma CVD devices, induction coupled RF high density plasma CVD devices, or the like may be employed. Additionally, variations of the above-described system, such as variations in susceptor design, heater design, RF power frequencies, location of RF power connections and others are possible. For example, the wafer could be supported and heated by quartz lamps. The layer and method for forming such a layer of the present invention is not limited to any specific apparatus or to any specific plasma excitation method.

II. Heating Assembly

Figure 2:
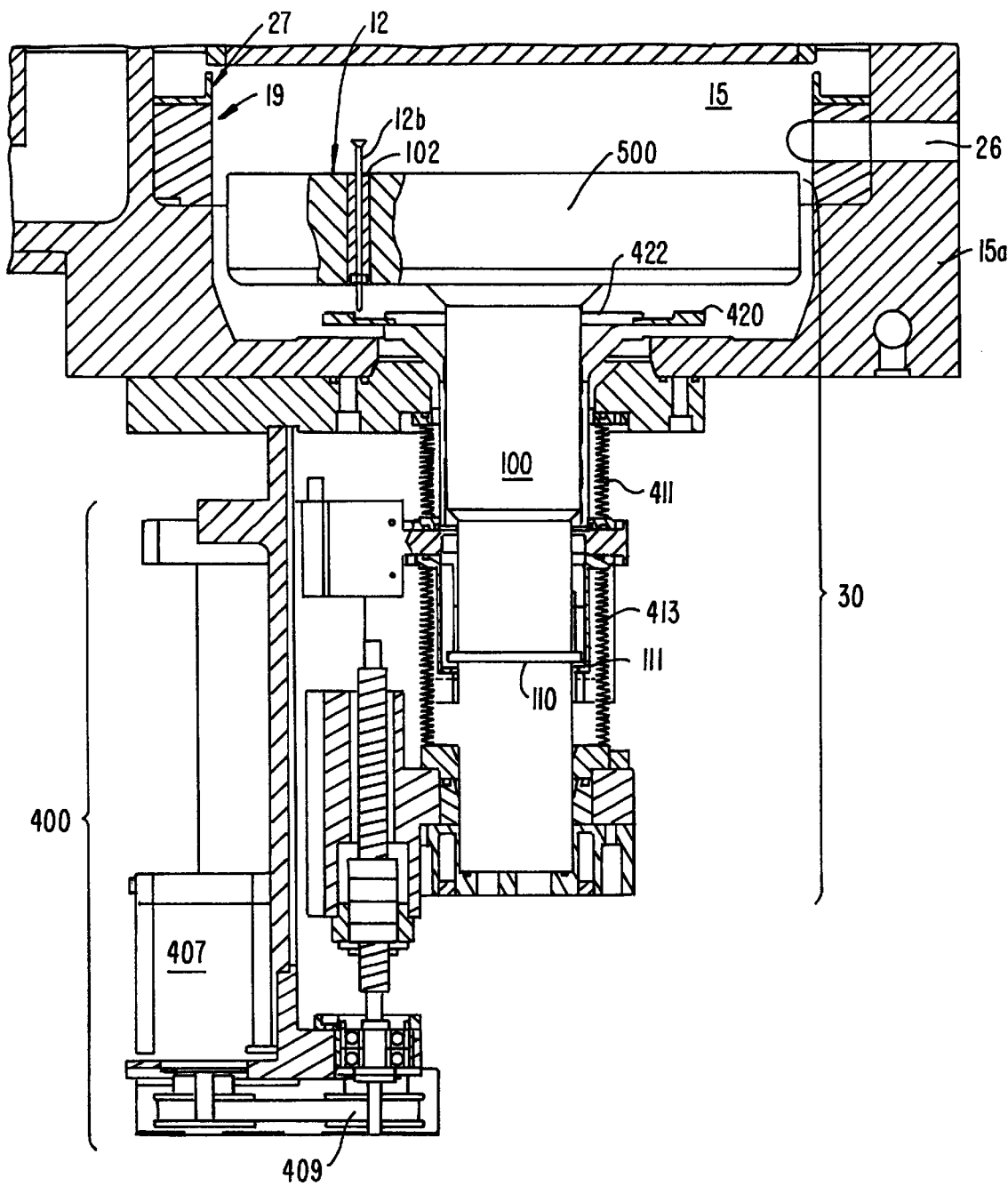
FIG. 2 depicts a detailed cross-section of the CVD apparatus of the present invention.

Referring to FIGS. 1A and 2, heating assembly 30 will now be described in detail. The heating assembly 30 functions to lift the wafer into the processing position within vacuum chamber 15 and to heat the wafer during processing. At the outset, it should be noted that heating assembly 30 may be modified for use, or directly placed into, a variety of processing chambers other than the exemplary SACVD chamber described and shown herein. For example, heating assembly 30 may be used in a similar CVD chamber that generates plasma with RF power, a metal CVD (MCVD) chamber, or other conventional or non-conventional semiconductor processing chambers (e.g. PE TEOS, plasma silane).

As shown in FIG. 2, heating assembly 30 generally includes a resistively-heated wafer support pedestal or heater 12 attached to a support shaft 100 and a drive assembly 400 for vertically moving the pedestal 12 and shaft 100 within chamber 15. The pedestal 12 of the heating assembly 30 preferably comprises a disc plate having a diameter of about 2–20 inches and a thickness of about 0.2 to 10 inches (see FIGS. 3A and 3B). In one embodiment, the disc is about ten inches in diameter and two inches thick. The pedestal includes an imbedded heater element 150 (FIG. 7) and contains four through holes 102 for lift fingers 12b (discussed below). The pedestal is preferably formed from a process compatible material and coated with a protective layer 500 (FIGS. 2 and 8A) resistant to cleaning and processing gases (discussed in more detail below). In a preferred embodiment, the pedestal is formed from aluminum or an aluminum alloy and coated with a protective layer 500 of aluminum oxide or similar ceramic material. The protective layer 500 covers at least wafer support surface 12a and may be applied to annular upper flange surface 12c (FIG. 3A), side peripheral surface 12d (FIG. 3B), or bottom surface 12e.

Figure 3A:
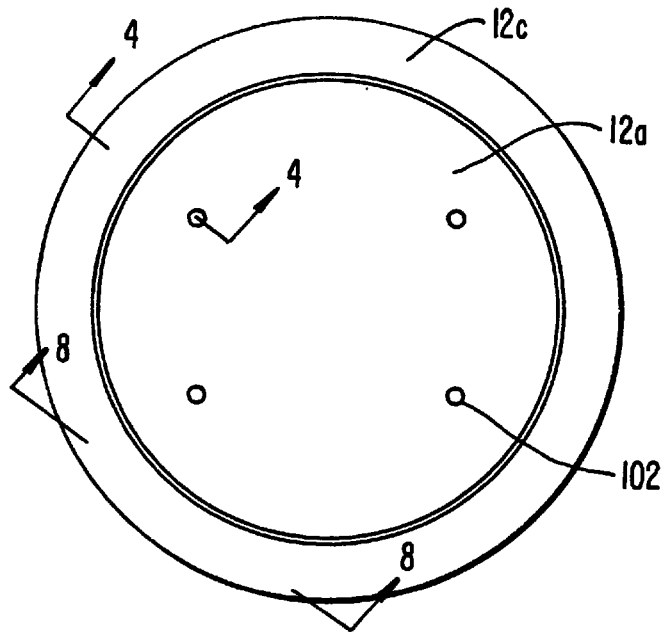
FIG. 3A shows a top view of a heater according to the present invention.
Figure 4:
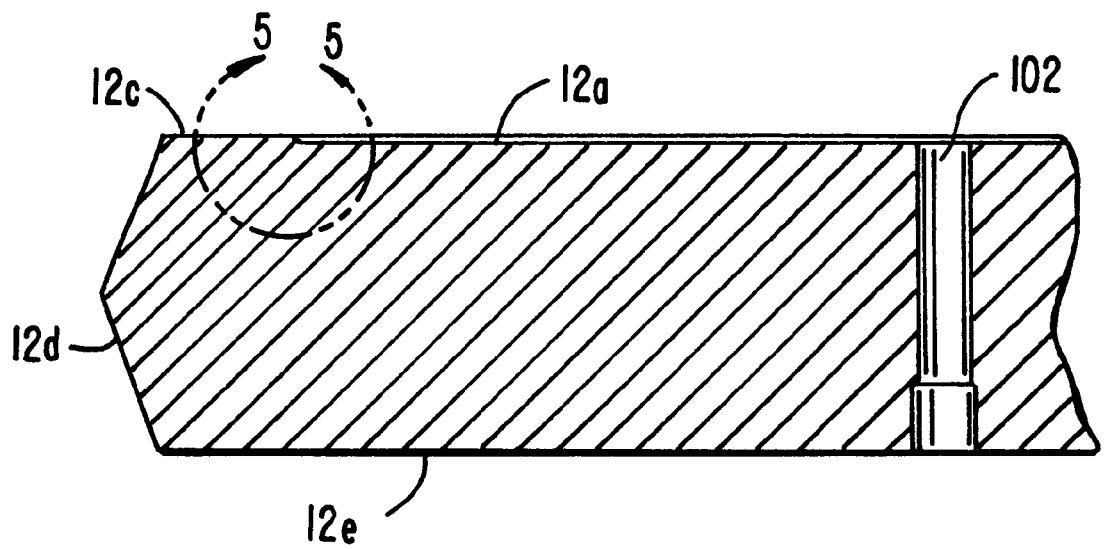
FIGS. 4 and 5 are detailed cross-sectional views of the heater of the present invention having a recessed area for locating a semiconductor wafer.
Figure 5:
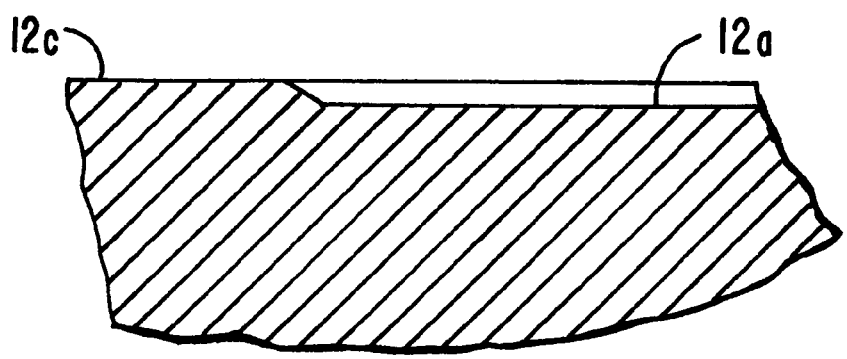

As shown in FIGS. 3A, 4, and 5, pedestal 12 includes an upper wafer support surface 12a surrounded by an annular upper flange surface 12c that is typically a raised perimeter so that the wafer is accurately located during processing. Wafer support surface 12a has a diameter approximately equal to the diameter of wafer W at the deposition temperature, e.g., at a temperature ranging from about 50–500° C. This diameter may be about 6—8 inches (about 150—200 mm) for large size wafers and about 3–5 inches (about 75–130 mm) for small size wafers. Of course, other wafer sizes such as those with about 12 inch (about 300 mm) diameters would be within the scope of the invention with appropriate modification of the chamber, the dielectric chamber lining 19, and support pedestal 12.

Drive assembly 400 may include a variety of driving mechanisms, including a pneumatic cylinder, controllable motor or the like. Preferably, a stepper motor 407 coupled to the heater via a suitable gear drive 409 operates to vertically drive pedestal 12 and shaft 100 in controlled increments between the loading/unloading and processing positions. Drive assembly 400 also includes upper and lower bellows 411, 413 attached between the midpoint of shaft 100 and the bottom of the processing chamber to allow for substantially free vertical movement of pedestal 12. In a preferred embodiment, upper bellow 411 provides more vertical resistance than lower bellow 413. As the shaft 100 traverses vertically downward, initially the shaft 100 is only displacing the lower bellow 413. As the shaft 100 continues traversing, flange 110 on the shaft 100 will hit stopper 111, engaging the resistive force of upper bellow 411. This design allows the pedestal 12 and shaft 100 to control when fingers 12b are engaged by flange 420 of a strike plate 422 to protrude from wafer support surface 12a. In addition, bellows 411, 413 allow some angular movement to ensure that the gas distribution faceplate 13a and the pedestal 12 are substantially parallel during processing.

A plurality of wafer-support/lift fingers 12b, usually at least two and preferably four, are slidably mounted within through holes 102 spaced about the periphery of pedestal 12 (see FIGS. 2 and 3A). Fingers 12b extend downward below pedestal 12 so that the strike plate flange 420 may engage fingers 12b and lift them above the upper surface of pedestal 12 for loading and unloading wafers. Lift fingers 12b are preferably made of a ceramic material, such as aluminum oxide, and generally have a double truncated cone shaped head (not shown) The four lift finger through holes 102 are preferably not uniformly distributed about the pedestal 12, but instead form a rectangle having at least one side that is wider than the width of the robot blade, which is typically a thin, flat bar (not shown), around which the lift fingers 12b must lift the wafer. The bottom end of the lift fingers 12b are rounded. The fingers 12b have a relatively thick diameter of about 100–200 mil, preferably about 150 mil, and a relatively short length of about 1–3 inches, preferably 2 inches, to minimize finger binding to the pedestal during processing.

In use, a robot blade (not shown) transfers the wafer to the chamber 15 when the pedestal 12 is in position opposite slit 26 (or actually just below slit 26). A suitable robotic transfer assembly is described in commonly assigned U.S. Pat. No. 4,951,601 to Maydan, the complete disclosure of which is incorporated herein by reference. The wafer is supported initially by lift fingers 12b, which are lifted above pedestal 12 with strike plate flange 420. As lift fingers 12b rise along with pedestal 12, they encounter a stop (not shown). As pedestal 12 continues to rise to the processing position opposite gas distribution faceplate 13a, lift fingers 12b sink into through holes 102 within pedestal 12 and the wafer is deposited onto wafer support surface 12a within annular flange 12c (FIGS. 2 and 3A). To remove the wafer from chamber 15, the above steps are performed in reverse.

Figure 7:
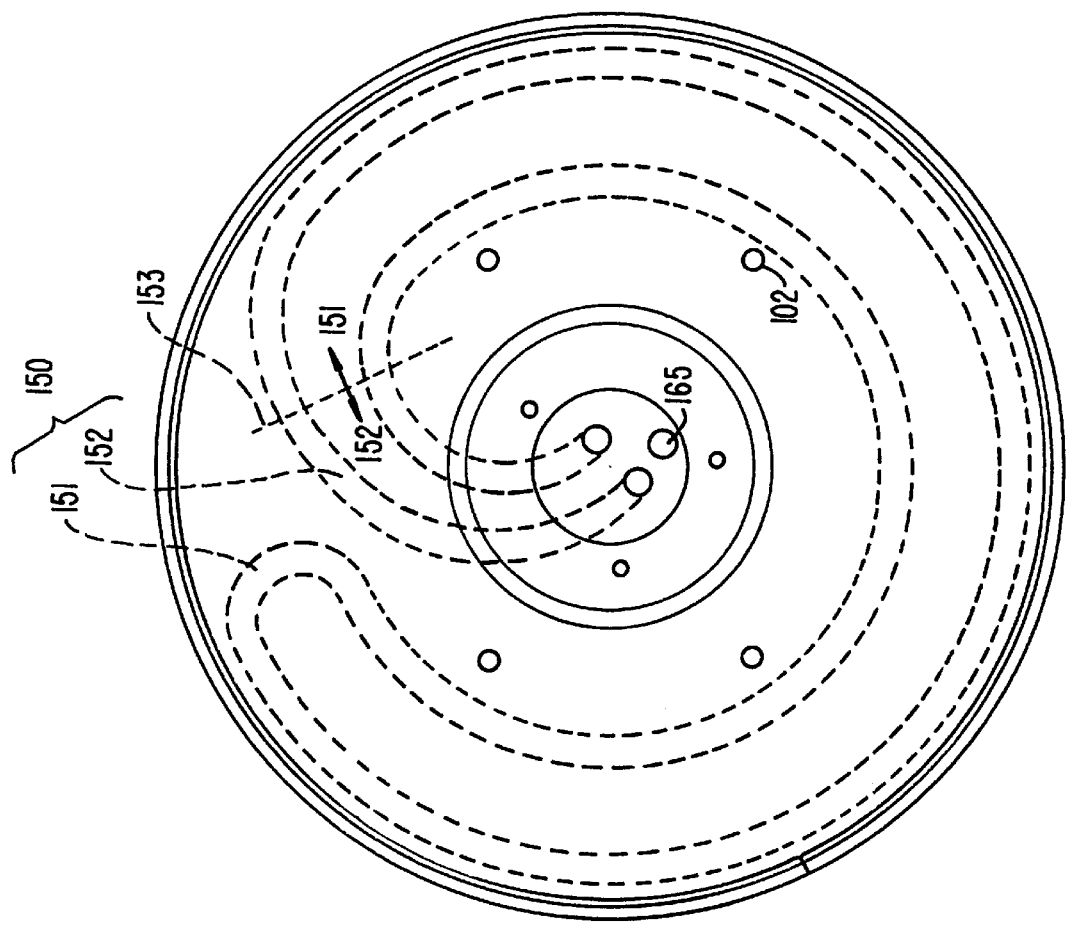
FIG. 7 is a top view of the pedestal of FIG. 6.
Figure 6:
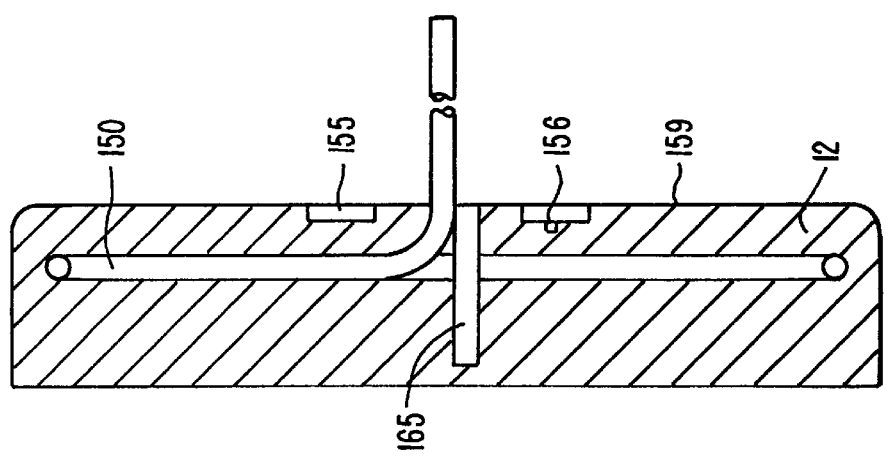
FIG. 6 shows a cross-section of the heater of the present invention and the heater coils therein.

FIG. 2 shows the resistively heated wafer support pedestal 12 attached to the support shaft 100. FIGS. 6 and 7 show the heating coil assembly 150 in more detail. The pedestal or platen 12 is a disc-shaped body fabricate, preferably, of high purity 100.1 grade, cast aluminum. A heater coil is sheathed in a heat tolerant, electrically insulating coating such as Stainless Steel or Inconel tube surrounding a magnesium oxide filler material encasing a nichrome heater element is embedded in the pedestal during the casting process. A heater coil assembly 150 includes a heater element 151 connected to its conductor lead wires 152 within the pedestal 12 by a cold junction approximately at the dashed line shown by 153 in FIG. 7. The heater element 151, typically a nichrome heater wire, is bonded to a copper wire 152 at approximately this boundary 153 so that the center of the base is not heated. However, all of the wires of the heater coil 150, whether primarily resistive or primarily conductive, are sheathed in the continuous insulating coating (such as described above) which tolerate high temperatures so as to withstand casting of the preferably aluminum or aluminum alloy core of heater pedestal 12.

Figure 3B:
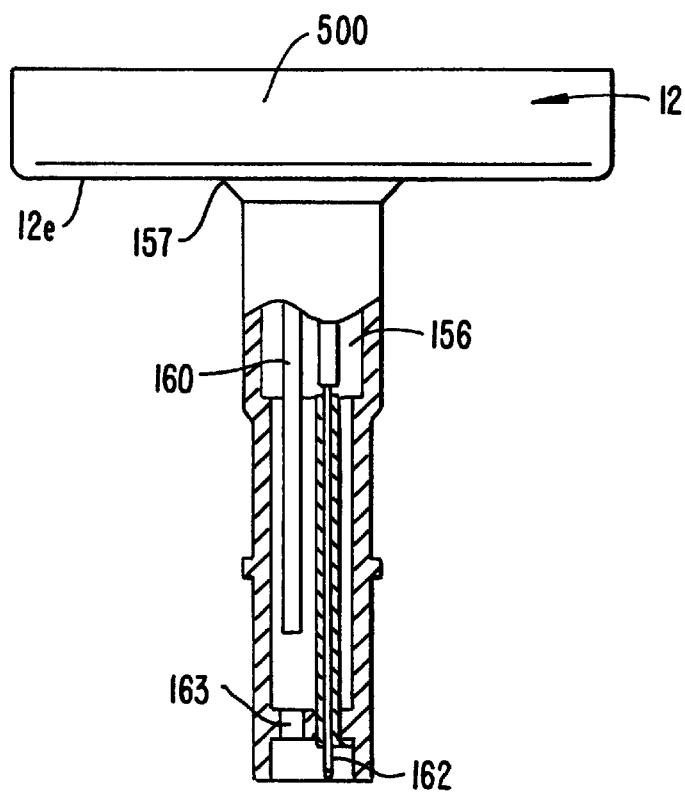
FIG. 3B shows a side view of the heater of the present invention, partially in cross-section.

The pedestal 12 includes an annular groove 155. A pedestal support shaft 100 (FIG. 3B) having a hollow core 156 is configured to mate (aligned according to alignment guides 156A) with the circular groove 155 (FIG. 6) to provide a stem for the pedestal 12. A peripheral electron beam weld at the joint 157 is made between the two pieces to provide a vacuum tight joint such that the hollow core 156, shown in the cutaway view of FIG. 3B, is at ambient (atmospheric) pressure. FIG. 3B shows a thermocouple tube 160 and the end of the coating 161 of the heater coil 150 and its conductor wiring leading to wire ends 162. A vacuum seal and ground connection for the pedestal shaft 100 are made at its bottom surface 12e (FIG. 3B) and connections to heater wire ends and connections 162 and the thermocouple tube end 163 are made at atmospheric conditions. The end of the thermocouple tube passage terminates in the thermocouple opening 165 of the pedestal 12.

As can be seen in FIG. 7 the routing of the heater coil 150 embedded in the pedestal 12 provides a single generally parallel loop running along lines of circles concentric to the center of the pedestal 12. This loop pattern provides heating to maintain a generally uniform temperature across the width of the plate while allowing for heat losses. The outer portion of the heater element is run at a diameter of approximately 9.5 in. (241.3 mm) and the inner portion of the heater element is run at a diameter of approximately 7.0 in. (177.8 mm) for a disc-shaped pedestal 12 having a typical diameter of about 10.0 in. (254 mm). The heater element is located 1.5 in. (38.1 mm) from the top surface of the pedestal 12.

III. Protective Layer

To carry out multiple process steps in situ in one chamber and to resist corrosion, the surfaces near the semiconductor wafer being processed should be able to resist the gases introduced for the various process and cleaning steps. To provide such resistance, the chamber 15 of the present invention includes a pedestal 12 coated with a protective layer 500. The protective layer 500 of the present invention is made from a material capable of withstanding process and cleaning gasses at high temperatures. The material preferably can withstand etching, corrosion, or deposition by argon-containing gases, oxygen-containing gases, nitrogen-containing gases, helium-containing gases, fluorine-containing gases, boron-containing gases, phosphorous-containing gases, and silicon-containing gases.

In preferred embodiments, the protective layer 500 comprises a ceramic such as aluminum oxide or aluminum nitride. The layer 500 may have a thickness between about 2 and 30 mils, preferably between about 5 and 10 mils. In specific embodiments, the layer 500 comprises aluminum oxide doped with about 1 to 2% titanium oxide. The amount of titanium oxide may be increased to as high as 5%. The dopant increases the electrical conductivity of the protective layer 500, which is particularly beneficial with a pure aluminum oxide layer which may have a electrical conductivity lower than the conductivity of certain other materials such as aluminum nitride. As materials like ceramics are dielectric in nature, charge buildup may occur as RF power passes from the wafer, through the protective layer, and to the pedestal core. The charge buildup creates electrostatic sticking of the wafer to the pedestal. Improved levels of electrical conductivity in the protective layer 500 will reduce the charge buildup between the wafer and the core of pedestal 12.

Figure 8A:
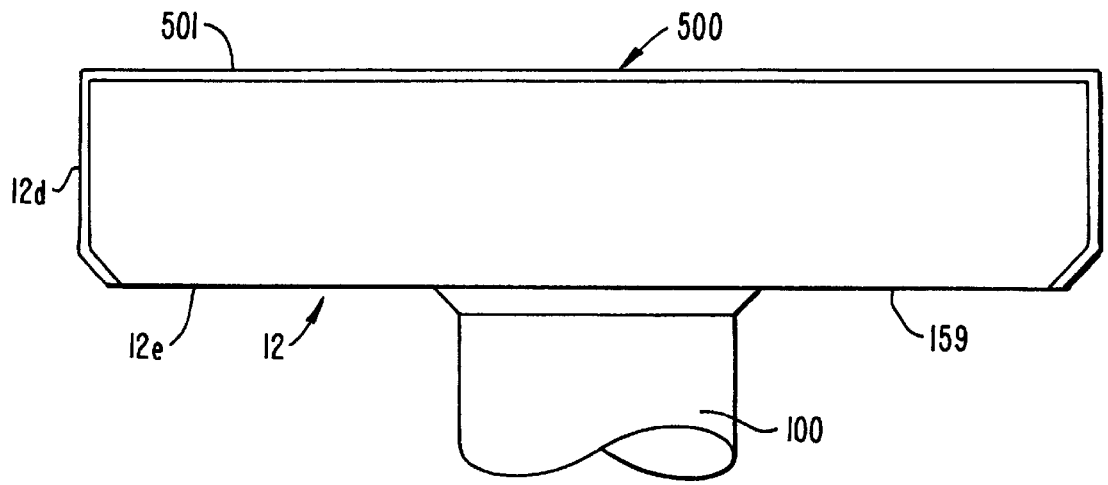
FIG. 8A depicts a detailed cross-sectional view taken along line 8—8 in FIG. 3A of the protective layer applied to the pedestal of the present invention.

Referring to FIG. 8A, the protective layer 500 preferably covers the entire upper surface 501, which comprises wafer support surface 12b and annular upper flange surface 12c (see FIG. 3A), and side peripheral surface 12d of the pedestal 12. Typically, the layer 500 must cover at least wafer support surface 12b (FIG. 3A). These are typically the areas most susceptible to the process and cleaning gases used in the chamber. The pedestal 12 is usually positioned close to the gas distribution plate 13a (see dotted line of FIG. 1A) so that only the immediate areas near the wafer are exposed to the harshness of the gases and plasma during processing or cleaning. Diffusion of the gas and plasma is limited by the chamber liner 19 which fits very closely about the pedestal 12 to restrict flow to lower portions of the CVD chamber 15.

The protective layer 500 of the present invention preferably has characteristics comparable to that of a sintered ceramic layer. The porosity of the present layer, defined as percent empty volume, is usually less than about 5%, preferably less than 2%, and most preferably less than about 1%. A low porosity protective layer 500 eliminates the extra bake out time necessary for effectively evacuating the pores in the layer. The low porosity further enhances the resistance of layer 500 to plasma bombardment and chemical corrosion during wafer processing. The low porosity decreases the adsorption of moisture and other gases into the ceramic layer, which enhances the quality of the semiconductor wafer being processed. The low porosity further provides corrosion protection for the underlying aluminum core of the pedestal.

The protective layer 500 further provides the following performance benefits. First, the relatively thin protective layer prevents electrostatic sticking between the pedestal and the wafer by providing a layer of dielectric material (i.e. ceramic) thin enough to allow any buildup of electrostatic charges to pass between the pedestal and the semiconductor wafer. Excessively thick layers of ceramic may cause electrostatic sticking of the semiconductor wafer to the pedestal due to the dielectric nature of the ceramic layer. The thickness prevents electrostatic charges from equalizing between the pedestal and the wafer, adhering the wafer to the pedestal. Second, having such a thin, dense layer of ceramic allows the use of materials like aluminum oxide without significant degradation in heat transfer between the imbedded heater coil 150 and the wafer. Aluminum oxide has a lower thermal conductivity than a material such as aluminum nitride, but due to the relatively minute thickness of the protective layer 500, the difference in conductivity has little impact on the efficiency of the imbedded heater 150. Finally, it is more economical, in terms of assembly and materials costs, to apply a thin layer of ceramic onto an aluminum pedestal than to create an entire pedestal of ceramic or a cover plate made of ceramic such as aluminum nitride.

IV. Detonation Gun Process

Applying the above described ceramic protective layer 500 to a pedestal can be problematic. A process like anodization, which can deposit ceramic (aluminum oxide) by immersion of the pedestal in an electrolytic solution, creates coverings that are porous and non-uniform. The resulting coverage does not have the thickness or density of a sintered ceramic. As a result, erosion and nodule growth on an anodized aluminum pedestal surface may take place in the chamber as the anodized layer is repeatedly exposed to the severe conditions present during wafer processing and during chemical cleaning.

Furthermore, other techniques for forming ceramics typically use a binder to promote sintering in the ceramic, thus failing to create a contaminant-free ceramic. The resulting ceramic material may contain residual binder left from the sintering process. As the semiconductor wafer being processed in the CVD chamber lies directly on a ceramic covered pedestal, any residual binder contained in the ceramic may cause contamination of the semiconductor wafer during processing, thereby degrading the quality of the semiconductor devices processed therein. To eliminate the problem of binder contamination and to create a dense, uniform layer of ceramic, the protective coating of the present invention is preferably applied using a detonation gun coating process.

Figure 9:
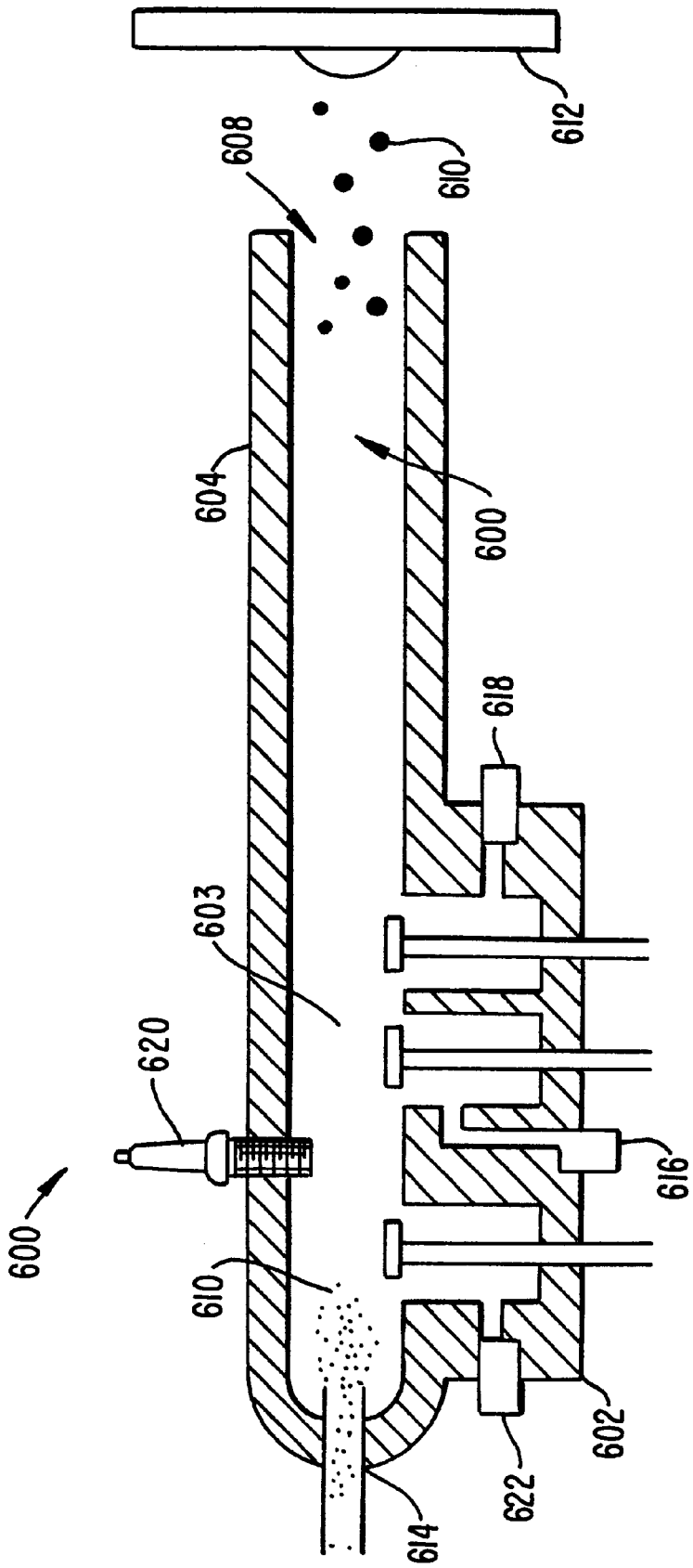
FIG. 9 illustrates a schematic cross-section of a representative detonation gun device used to coat the pedestal of FIG. 2 with a protective layer of material.

The detonation gun coating process comprises combining a coating material, preferably in the form of a powder, with a fuel gas mixture in a conventional or specialized detonation gun. FIG. 9 schematically illustrates a representative detonation gun 600 having a main body 602 defining an inner combustion chamber 603 and a gun barrel 604 defining an inner passage 606 in communication with combustion chamber 603. Gun barrel 604 includes a nozzle 608 for discharging powder particles 610 onto a workpiece 612, such as wafer support surface 12b and annular upper flange surface 12c of pedestal 12. Gun 600 further includes a powder inlet port 614 and two fuel gas inlet ports 616, 618 for injecting a fuel gas mixture of at least one combustible gas. A spark plug 620 extends into chamber 603 for igniting the fuel gas mixture.

The fuel gas mixture, such as oxygen-acetylene, is ignited to produce a detonation wave which travels down barrel 604 of the gun 600, where it heats the coating material and propels the coating material out of the gun and onto the generally planar surface of the workpiece 612. According to the method of the present invention, the powder supplied to the detonation gun 600 is a relatively pure form of aluminum oxide that contains a substantially low amount of contaminants (on the order of less than 400 ppm). Unlike prior art processes like plasma spray, in the detonation gun process, metallic particles are typically not removed from the gun barrel 604 and deposited onto the pedestal. In fact, it has been found that the percentage of contaminants in the resulting protective layer 500 is substantially less than the percentage of contaminants in the aluminum oxide powder. This increases the yield and decreases the cost of manufacturing the wafer support pedestal 12.

Preferably, the invention will utilize at least two combustible gases selected from the group of saturated and unsaturated hydrocarbons. The group may include acetylene, propylene, methane, ethylene, methyl acetylene, propane, ethane, butadienes, butylenes, butanes, cyclopropane, propadiene, cyclobutane and ethylene oxide. The preferred fuel mixture comprises oxygen and acetylene. A variety of detonation guns having the structure described above or an equivalent structure can be adapted for use in the inventive process. For example, detonation guns that are suitable for the present invention are known under the trade names of D-gun™ and Super D-gun™ manufactured by Praxair S.T., Inc. of Indianapolis, Ind.

In use with the present invention, a mixture of oxygen and acetylene is fed through ports 616, 618 into combustion chamber 603 and a charge of aluminum oxide powder 610 is fed through port 614 via a carrier gas, such as nitrogen or air, into chamber 602. The fuel gas is ignited with spark plug 620 and the resulting detonation wave accelerates powder 610 through passage 606 of barrel 604 and heats powder 610 to a temperature above its melting point. The detonation wave typically attains a velocity of about 2800 to 3300 m/s and the particle velocity is typically about 700 to 1000 m/s.

Nozzle 608 of gun barrel 604 is preferably positioned between about 50 to 200 mm from the target surface of workpiece 612 so that the powder particles 610 spray out onto the workpiece 612 to form the protective layer 500.

The protective layer 500 (FIG. 8A) uniformly covers the entire upper surface 12b and 12c of the pedestal 12 except for the region overlying four lift pin holes (FIG. 3A). The protective layer 500 is preferably made from a ceramic powder that is sprayed over upper surface of support body to form a thin ceramic layer thereon (usually on the order of about 0.010 inches). The ceramic powder may comprise alumina, aluminum oxide, an alumina/titanic composite, or the like. Preferably, the powder substantially comprises aluminum oxide, usually at least about 99% and preferably at least about 99.5%. The aluminum oxide particles will typically have a small particle size, i.e., about 99 percent of the particles in the aluminum oxide powder are less than about 150 microns (maximum lateral dimension) and less than about 5% of the particles are under about 13 microns. This small particle size increases the uniformity of the heating during the detonation gun process discussed below. In one embodiment of the pedestal, after the roughly 10 mils layer of ceramic is applied, the layer may be ground down to about 4 to 6 mils or some other desired thickness. Typically, only the wafer support area is further ground. The other areas may be left as sprayed. Those areas not to be sprayed are covered with protective covering.

The detonation gun technique provides a layer having surface qualities, ceramic purity, and thickness typically superior to an anodized or sintered ceramic. The layer of ceramic achieved through detonation gun processing has characteristics similar to that of a sintered ceramic, while minimizing contamination from binder additives typically used in manufacturing a sintered ceramic. The detonation gun layer is about 10–20 times thicker than ceramic coverage that may be formed from anodization and has a significantly higher density and a lower porosity, usually less than about 5%, preferably less than about 2%, and most preferably less than about 1% (porosity defined as percent empty volume).

Figure 8B:
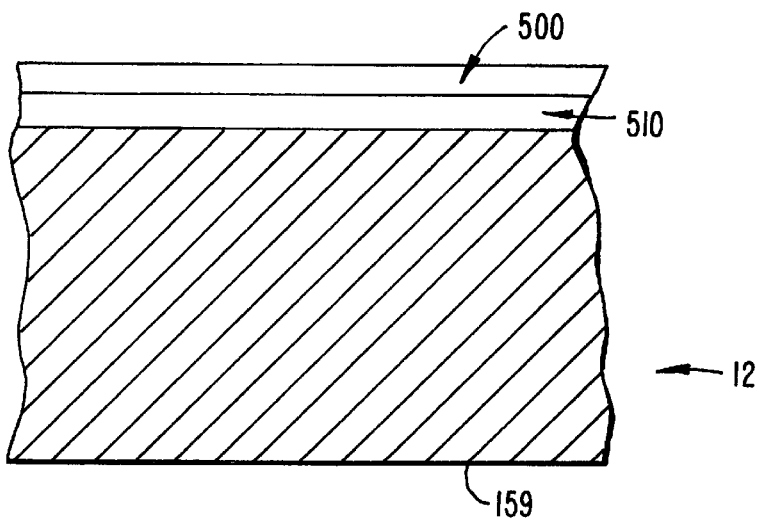
FIG. 8B is a detailed cross-sectional view of the transition layer and protective layer on the pedestal.

In an exemplary embodiment, the pedestal 12 of the present invention is first coated with a transition material, such as nickel, having a coefficient of thermal expansion between that of the protective layer 500 (e.g. alumina with a coefficient of $8.7 \cdot 10^{-6}$ m/m·° C.) and the process compatible material of the pedestal (e.g. aluminum with a coefficient $22 \cdot 10^{-6}$ m/m·° C.). A material such as nickel has a coefficient of thermal expansion of $11 \cdot 10^{-6}$ m/m·° C. Due to the substantial difference in the coefficient of thermal expansion for alumina and aluminum, repeated heating and cooling of the pedestal 12 can cause microcracking in a layer of alumina applied directly to an aluminum pedestal. The nickel layer restrains the expansion of the underlying aluminum and thus minimizes microcracking of the outer alumina layer. FIG. 8B depicts a cross-section of the pedestal 12 showing the transition layer 510 covered by the protective layer 500. The layer 510 may be applied to create a thickness of about 7 to 10 mils and then machine polished to about 4 to 6 mils. The bare aluminum surface or the transition material coated pedestal may be grit blasted per process by Praxair S.T., Inc. of Indianapolis, Ind. prior to coating by the protective layer 500. This blasting improves adherence of protective layer 500 to the pedestal 12.

Although the foregoing invention has been described in detail for purposes of clarity of understanding, it will be obvious that certain modifications may be practiced within the scope of the appended claims.

What is claimed is:

1. A wafer support pedestal for heating and including a wafer support surface for supporting a semiconductor wafer in a deposition apparatus, the pedestal formed by a process comprising:

coating at least the wafer support surface of the pedestal with a transition material;

introducing ceramic powder into a combustible gas mixture;

combusting the gas mixture and powder together; and propelling the combusted powder onto the pedestal to form a thermally and chemically protective layer over at least the wafer support surface on the pedestal, wherein the transition material disposed between the pedestal and the protective layer has a coefficient of thermal expansion between the coefficient of thermal expansion of the protective layer and the coefficient of thermal expansion of the pedestal.

2. The pedestal of claim 1 wherein propelling the combusted powder comprises producing a detonation wave and accelerating the combusted powder to a speed of at least about 700 m/s, and wherein accelerating the combusted powder comprises heating the powder to a temperature near the melting point of the powder.

3. The pedestal of claim 1 wherein introducing the ceramic powder comprises providing a powder having at least about 99.5% by weight aluminum oxide.

4. The pedestal of claim 1 wherein the protective layer has a porosity less than about 1% of the volume of the protective layer.

5. The pedestal of claim 1 wherein the transition material comprises nickel.

6. The pedestal of claim 1 wherein the process further comprises polishing the transition material before forming the protective layer on the pedestal.

7. The pedestal of claim 1 further comprising grit blasting the transition material prior to forming the protective layer.

8. The pedestal of claim 1 wherein the process further comprises grinding the protective layer over the wafer support surface down to a desired thickness.

9. The pedestal of claim 1 further comprising an imbedded heating coil.

10. A substrate support pedestal including a substrate support surface, the pedestal having a protective layer formed by a process comprising:

introducing ceramic powder including at least about 99.5% by weight aluminum oxide into a combustible gas mixture;

combusting the ceramic powder with the gas mixture; and propelling the combusted ceramic powder onto the pedestal to form the protective layer over at least the substrate support surface on the pedestal, wherein the pedestal includes a transition material disposed between the substrate support surface and the protective layer, the transition material having a coefficient of thermal expansion between the coefficient of thermal expansion of the protective layer and the coefficient of thermal expansion of the pedestal.

11. The substrate support pedestal claim of 10 wherein the transition material comprises nickel.

12. The substrate support pedestal of claim 11 wherein the pedestal comprises aluminum.

* * * * *